United States Patent [19]

Hipps, Sr. et al.

[11] Patent Number: 5,134,052
[45] Date of Patent: Jul. 28, 1992

[54] PROCESS FOR FORMING IMAGES USING A LOW TEMPERATURE EXPOSURE STEP

[75] Inventors: Jesse Hipps, Sr., Miamisburg; Lyudmila Feldman, Centerville, both of Ohio

[73] Assignee: The Mead Corporation, Dayton, Ohio

[21] Appl. No.: 262,545

[22] Filed: Oct. 25, 1988

[51] Int. Cl.$^5$ .............................................. G03C 1/72
[52] U.S. Cl. .................... 430/138; 430/281; 430/327; 430/494
[58] Field of Search ............... 430/138, 281, 327, 494; 522/5

[56] References Cited

U.S. PATENT DOCUMENTS

| | | | |
|---|---|---|---|
| 4,138,300 | 2/1979 | Kaetsu et al. | 204/159.22 |
| 4,399,209 | 8/1983 | Sanders et al. | 430/138 |
| 4,416,966 | 11/1983 | Sanders et al. | 430/138 |
| 4,742,374 | 5/1988 | Yamamoto et al. | 355/27 |
| 4,770,972 | 9/1988 | Nelson et al. | 430/138 |
| 4,772,530 | 9/1988 | Gottschalk et al. | 430/138 |
| 4,772,541 | 9/1988 | Gottschalk et al. | 430/339 |
| 4,800,149 | 1/1989 | Gottschalk et al. | 430/138 |
| 4,804,611 | 2/1989 | Geis | 430/138 |
| 4,816,368 | 3/1989 | Skaggs | 430/138 |
| 4,842,980 | 6/1989 | Gottschalk et al. | 430/138 |
| 4,864,356 | 9/1989 | Asano et al. | 355/30 |

*Primary Examiner*—Marion E. McCamish
*Assistant Examiner*—Janis L. Dote
*Attorney, Agent, or Firm*—Thompson, Hine and Flory

[57] ABSTRACT

The present invention relates to a method for exposing a photosensitive imaging sheet using a low temperature exposure step. The method includes the steps of:

providing an imaging sheet including a substrate having provided on one of its surfaces a layer of microcapsules, said microcapsules containing an image-forming agent and a photohardenable composition comprising a free radical addition polymerizable or cross-linkable compound and a photoinitiator, said photoinitiator being capable of absorbing actinic radiation and producing free radicals which initiate free radical polymerization or cross-linking of said polymerizable or cross-linkable compound;

cooling said imaging sheet to a temperature below ambient temperature; and image-wise exposing said imaging sheet to actinic radiation while said imaging sheet is at said below ambient temperature.

18 Claims, 1 Drawing Sheet

PROCESS FOR FORMING IMAGES USING A LOW TEMPERATURE EXPOSURE STEP

BACKGROUND OF THE INVENTION

1. Field of the Invention

The present invention relates to a method for producing positive images by employing photosensitive microcapsules. More particularly, the present invention utilizes a low temperature exposure step to cause the microcapsules to be less susceptible to the reversal phenomenon caused by short time scale reciprocity failure.

2. Description of the Prior Art

Photosensitive imaging systems employing microencapsulated radiation sensitive compositions are the subject of commonly assigned U.S. Pat. Nos. 4,399,209 and 4,416,966 to The Mead Corporation as well as copending U.S. patent application Ser. No. 320,643 filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Image-wise exposure hardens the internal phase of the microcapsules as a result of the photoinitiator generating free radicals which initiate polymerization of the polyethylenically unsaturated compound by free radical addition polymerization. Following exposure, the imaging sheet is subjected to a uniform rupturing force by passing the sheet between a pair of pressure rollers.

U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules rupture and image-wise release the internal phase whereupon the color-former migrates to the developer sheet where it reacts with a dry developer and forms a color image. The imaging system can be designed to reproduce monochromatic or polychromatic full color images.

U.S. Pat. No. 4,440,846 discloses a so called "self-contained" imaging system wherein both the image-forming agent and the developer material are located on the same substrate. In the system according to U.S. Pat. No. 4,440,846, the image-forming agent is encapsulated in a layer of pressure rupturable capsules, and the capsules are exposed and ruptured to cause the image-forming agent to contact and react with the developer to produce an image on the substrate.

A phenomenon known as short time scale reciprocity failure has limited the use of the aforementioned imaging systems to lower intensity radiation sources for longer periods of time. Certain high intensity light sources, such as lasers, useful in high speed copying have not been used effectively because the photohardenable compositions do not respond well to high intensity radiation.

At time scales less than 0.1 seconds, two types of reciprocity failure have been observed to occur with various types of photosensitive material. Failure of the first type occurs around 0.001 seconds for most systems and results in a progressive loss of sensitivity down to about 1 microsecond. The total loss at 1 microsecond, compared to 1 second, is expected to be about a factor of 10 for most systems. Whether further losses below the microsecond level occur by this type of failure is not known. The mechanistic cause of the failure is believed to be a chemical inefficiency due to high concentrations of free radicals. The radicals react with each other rather than doing the chemistry expected of them.

The second type of failure at short time scales is found in a few types of photosensitive materials. When this type of failure occurs, it is quite severe, causing an instant loss of a factor of 10 in sensitivity. This catastrophic loss has been observed to occur in different systems ranging from seconds to microseconds regions.

Most scientists who deal with photographic materials are familiar with the "H & D" (D log H) curve. The H & D curve characterizes the way in which a photographic material responds to light. An H & D curve is shown in the FIGURE. If the system is "well behaved," there is a relationship between energy or exposure and image density which defines the energy requirements of an exposure device. This region is represented by A on the FIGURE. In other areas, as is represented by B on the FIGURE, the imaging system is not well behaved and results in a broken or reverse proportionality between increased exposure and density. The region represented by B is the "reversal region" and depicts the second type of failure referred to above (i.e., short time scale reciprocity failure).

In well behaved regions of an H&D curve, for a given photosensitive material the degree of polymerization is essentially a function of exposure. Exposure may be quantitively expressed as a product of the intensity of the radiation source and the time of exposure. Accordingly, these two variables can be appropriately manipulated to provide a given exposure. In theory, as long as the desired exposure is obtained by any manipulation of intensity and time, a predetermined amount of polymerization should occur.

In regions where short time scale reciprocity failure occurs, the rate of polymerization slows to a point at which the photohardenable composition never fully polymerizes. A given level of exposure does not produce a corresponding degree of polymerization. When the photohardenable composition is microencapsulated and used in the aforementioned imaging systems, the system is unable to reach Dmin.

The reversal phenomenon varies widely amongst systems containing photosensitive materials. For some systems, reversal can occur only when subjecting the photosensitive composition to intensities and exposure times which cannot practically be achieved using present technology. For these systems short time scale reciprocity failure does not pose a serious problem. For other systems, short time scale reciprocity failure can pose a problem which must be overcome to enable the production of images. The problems are particularly apparent in systems which are subjected to high intensity radiation.

While not wishing to be bound by any particular theory, it is believed that short time scale reciprocity failure is in large part a function of the monomer used and the type and concentration of the photoinitiator. In systems where noticeable short time scale reciprocity failure occurs, it is hypothesized that termination reactions occur at a faster rate than the propagation reactions as a result of either the photoinitiator being depleted in the microcapsules before the monomer has had an opportunity to polymerize, or by the creation of a polymerization inhibitor or a radical scavenger in the microcapsules. Moreover, once the photosensitive material has encountered failure as a result of "reversal," the reversal effect cannot be corrected.

For some photosensitive materials, it has been difficult, if not impossible, to develop a system utilizing high intensity short time scale exposures because of the risk of reversal. When utilizing photopolymerizable systems as described above for copying documents, it is desirable to minimize the time of exposure to enable the production of copies at a fast rate. In systems which exhibit noticeable short time scale reciprocity failure, lower intensity radiation sources, and accordingly, longer exposure times are required to produce images. Accordingly, the number of copies produced per minute in such systems have been limited.

In addition, it has long been desired to utilize high intensity sources such as lasers as light sources for photosensitive imaging systems because of their monochromatic spectral characteristics and their ability to be easily controlled, such as by computer control as is known in the art. The use of lasers has been limited in some photosensitive systems as the high intensities of the lasers have caused some photosensitive materials to reverse as a result of short time scale failure.

Thus, there exists a need in the art for a method to reduce the susceptibility of a photo-sensitive composition to reversal upon exposure to thereby enable the production of a large number of copies per minute and the use of high intensity radiation sources.

DEFINITIONS

The term "reversal time" refers to the exposure time for a given exposure (E) (where E equals intensity (I) $\times$ Time (T)) below which the photosensitive material is unable to reach Dmin. At exposure times greater than the reversal time for a given exposure (I$\times$T), Dmin is reached, i.e., the photosensitive material obeys reciprocity and does not exhibit reversal (We assume in this discussion that exposure times do not become so great that another mechanistic phenomenon known as long time scale reciprocity failure occurs. See Arney, "Oxidation Kinetics and Reciprocity Behavior in the Microencapsulated Acrylate Imaging Process," *J. Imaging Science* 31:27–30 (1987)). In microencapsulated photosensitive materials increases in intensity for exposure time periods less than the reversal time produces proportional increases in image density.

SUMMARY OF THE INVENTION

In accordance with the present invention, a process for forming positive images is disclosed. The process is characterized by image-wise exposing photosensitive microcapsules at lower than ambient temperatures to shorten the reversal time of the microcapsules and thereby enable the composition to polymerize by high intensity, short term exposures.

For purposes of this invention, the propensity of a photosensitive material undergoing reversal is measured by its reversal time. Assuming that the exposure required to begin polymerization is a given value, and that the intensity of the radiation source is a predetermined value, the exposure time required to begin polymerization may be easily determined by dividing the exposure by the intensity of the radiation source. If the required exposure time is greater than the reversal time, the photosensitive material will not reverse and the radiation source may be used to produce an image. If the exposure time is less than the reversal time, the photosensitive material is subject to the reversal phenomenon which can result in partial or no polymerization and the radiation source cannot be used at the predetermined intensity.

In the present invention, the reversal time for a given material is shortened. By shortening the reversal time, higher intensity radiation sources may be utilized. As the photosensitive material is utilized to produce copies, more copies per minute can be produced. The inventors have discovered that by performing an image-wise exposure at lower temperatures, the reversal time for a photosensitive material can be shortened, and the tendency for reversal can be minimized. Moreover, for systems which do not pose a significant risk of reversal, temperature may be utilized to manipulate system performance variables such as film speed, contrast, dynamic range and the like.

The relationship between the temperature of the substrate during exposure and the reversal time is explained in the following hypothetical example. If the theoretical exposure required for polymerization of a material is 2000 erg /cm$^2$ and the radiation source is capable of delivering radiation at an intensity of 1000 erg/cm$^2$ sec the source must be activated for 2 seconds to effectuate polymerization. If the reversal time for the hypothetical material is 4 seconds, the reversal phenomenon will set in and the material will either not polymerize or will polymerize at a much slower rate than expected. In any event, the photosensitive composition will not reach $D_{min}$. According to the present invention, the temperature of the composition is lowered to reduce the reversal time. If the above hypothetical material is cooled to 10° C. such that the resulting reversal time is shortened to 1 second, when using the same radiation source for 2 seconds, the composition polymerizes and achieves $D_{min}$.

In accordance with one embodiment of the present invention, a method for exposing a photosensitive imaging sheet comprises the steps of:

providing an imaging sheet including a substrate having provided on one of its surfaces a layer of microcapsules, said microcapsules containing an image-forming agent and a photohardenable composition comprising a free radical addition polymerizable or cross-linkable compound and a photoinitiator, said photoinitiator being capable of absorbing actinic radiation and producing free radicals which initiate free radical polymerization or cross-linking of said polymerizable or cross-linkable compound;

cooling said imaging sheet to a temperature below ambient temperature; and image-wise exposing said imaging sheet to actinic radiation while said imaging sheet is at said below ambient temperature.

In another embodiment, the present invention relates to a method for exposing a full color photosensitive imaging sheet. The method comprises the steps of:

providing an imaging sheet including a substrate having provided on one of its surfaces a coating comprising a first set of microcapsules including a first image-forming agent and a photohardenable composition being sensitive to a first band of radiation associated with said first image-forming agent, a second set of microcapsules including a second image-forming agent and a photohardenable composition being sensitive to a second band of radiation associated with said second image-forming agent, and a third set of microcapsules including a third image-forming agent and a photohardenable composition, being sensitive to a third band of radiation associated with said third image-forming agent;

cooling said imaging sheet to below ambient temperatures; and image-wise exposing said imaging sheet to said three bands of actinic radiation.

It is an object of the present invention to image-wise expose the photosensitive microcapsules at below ambient temperatures to enable the use of high intensity radiation sources, such as lasers.

It is yet a further object of the present invention to produce monochromatic or full-colored images in a process wherein photosensitive microcapsules are image-wise exposed at lower than ambient temperatures.

It is an additional object of the present invention to provide a photocopy system which is capable of producing photocopies at increased rates.

These, and other objects will be readily recognized and understood by one skilled in the art as reference is made to the following detailed description of the preferred embodiments.

BRIEF DESCRIPTION OF THE DRAWINGS

The FIGURE depicts an H&D curve of a photosensitive composition which exhibits short time scale reversal.

DETAILED DESCRIPTION OF THE PREFERRED EMBODIMENTS

Figure 1:
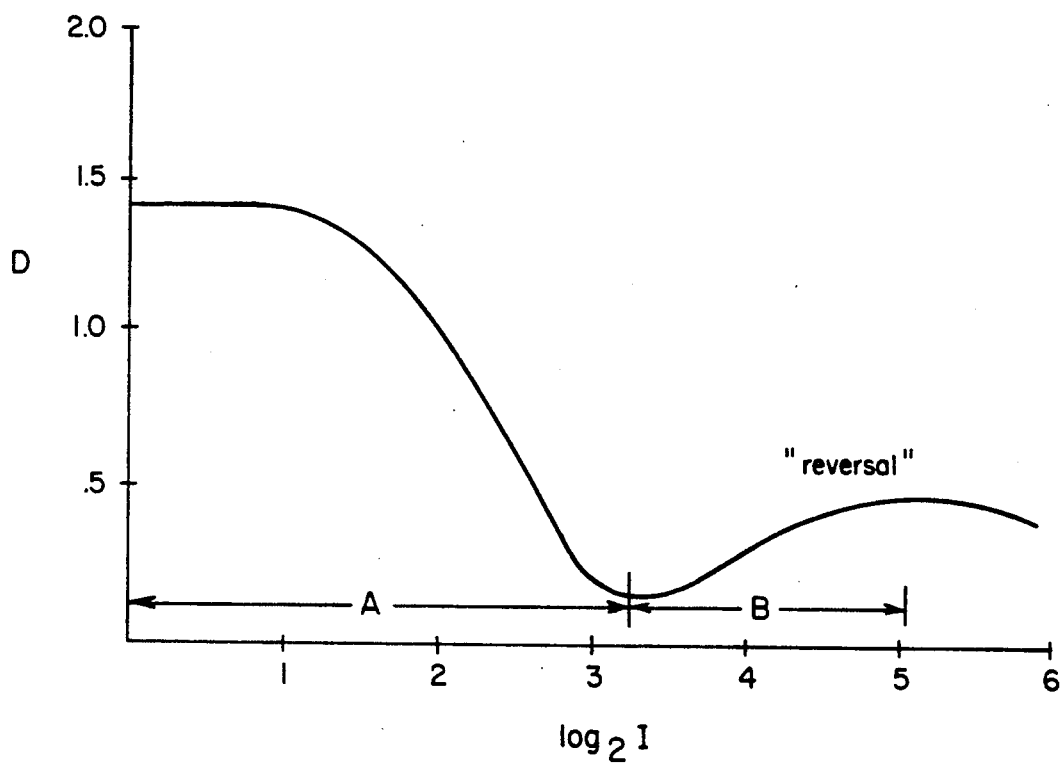

While describing the preferred embodiments, specific terminology will be utilized for the sake of clarity. It is to be understood that such terminology includes not only the recited embodiments, but all technical equivalents which perform substantially the same function in substantially the same way to obtain the same result.

To initiate the process according to the present invention, an imaging sheet must be provided. The imaging sheet has on one of its surfaces a layer of microcapsules coated thereon. The microcapsules contain a photohardenable composition including a radiation curable composition and a photoinitiator. Photohardenable compositions such as photopolymerizable and photo-cross-linkable materials increase in viscosity or solidify upon exposure to radiation. The photoinitiators selected are typically those which are photosensitive and able to generate free radicals to initiate polymerization of the photopolymerizable or cross-linkable material. In association with the microcapsules is an image-forming agent.

The inventive process has been designed with the intent of minimizing or preventing short time scale reciprocity failure. As has been discussed above, short time scale reciprocity failure leads to a reversal phenomenon wherein the density of the photosensitive composition is unable to reach a minimum value in certain exposure regions such that exposure and density are inversely related.

Various radiation sensitive materials, photoinitiators and image-forming agents can be used in conjunction with the photographic materials of the present invention.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators potentially useful in the present invention may be selected from among diaryl ketone derivatives, quinones, benzoin alkyl ethers, alkoxy phenyl ketones, 0-acylated oximinoketones, polycyclic quinones, phenanthrenequinone, naphthoquinone, diisopropylphenanthenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes and bishexaryl imidiazoles. In many cases it is advantageous to use a combination with imaging photoinitiators.

Initiators including the ionic dye complexes may preferably include an autoxidizer. Suitable examples include N,N,-dialkylanilines as described in the European Publication.

Various image-forming agents can be used in association with the radiation curable composition. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Chemical Co.) are often used alone or in combination as color precursors in the present invention, as are commercially available cyan, magenta and yellow color forming agents.

The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which oleophilicity is enhanced by the addition of resourcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred.

The mean microcapsule size used in the present invention generally ranges from about 1 to 25 microns.

The most common substrate for imaging sheets in accordance with this invention is a plastic film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized Mylar (PET). The microcapsules can be located on either the top or bottom surface of a substrate to form an imaging sheet.

The substrate is then cooled to below ambient temperatures and is exposed to actinic radiation. The inventors have surprisingly discovered that lowering of the temperature of the substrate acts to significantly lower the reversal time of the photosensitive composition in compositions which exhibit reversal. Experimental studies have demonstrated that for a given photosensitive material, lowering of the temperature of the material to below ambient temperatures can reduce the reversal time of the composition by at least a factor of 10, if not greater. In the preferred embodiment of the present invention the temperature of the substrate is lowered to between about $-30°$ C. and about $15°$ C.

The cooled substrate is then image-wise exposed to actinic radiation, preferably radiation in the ultraviolet, visible or infrared wavelengths. As a result of the low temperature of the substrate, higher intensity exposures may be utilized. In the preferred embodiment, commercially available lasers or high intensity broad band visible sources capable of providing intensities between 1000 ergs/cm$^2$ sec and 32000 ergs/cm$^2$ sec are preferred.

After the image-wise exposure step, the microcapsules on the substrate are subjected to a uniform rupturing force in the presence of a developer material to rupture the microcapsules and form an image.

Where the image-forming agent is not a dye or pigment, a developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5-di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. A preferred class of glossable developers is described in commonly assigned U.S. Application Ser. No. 073,036, filed Jul. 14, 1987.

The developer material may be located on a support separate from the imaging sheet to thereby form a transfer image coating system. In such a system the imaging sheet and the developer sheet are brought together in the presence of a uniform rupturing force to cause the image-forming agent to migrate to the developer sheet and form an image on the developer sheet. The support may be made of paper, or a transparent film such as polyethylene terephthalate.

Alternatively, the developer material may be located on the same surface as the layer or microcapsules to form a self-contained sheet. In this configuration, the substrate is coated with a first coating of developer material and then a second coating of the photosensitive microcapsules. Alternatively, the microcapsules and developer material can be admixed and coated as a single layer as is readily understood in the art.

The inventive method may be practiced in connection with a simple copying apparatus, such as that disclosed in U.S. Pat. Nos. 4,742,374 and 4,770,972, which is modified to include an exposure temperature control station which functions to monitor the temperature of exposure of the imaging sheet. Such an apparatus includes a radiation source operable to provide one or more bands of actinic radiation for exposing the substrate having a layer of photosensitive microcapsules on one of its surfaces to one or more bands of actinic radiation. In association with the radiation source are heating and/or cooling elements which function to either heat or cool the substrate during exposure. Also included is an optical system for focusing the one or more bands of actinic radiation onto the substrate and forming a latent image on the substrate and a developing device for developing the latent image into a visible image onto the exposed substrate or onto a receiver substrate. The presence of the temperature control station in connection with the imaging sheet at the site of exposure enables one to reduce the risk of reversal of the photosensitive imaging material as well as control sensimetric behavior of the material such as film speed, contrast, dynamic range and the like. Moreover, it has been discovered that if the exposure temperature is maintained at a constant, the produced hue of the image is uniform. Accordingly, the temperature control station is additionally used to provide a constant temperature during the duration of exposure.

By performing the above-described method images are produced. Moreover, as the images can be produced by utilizing higher intensity exposures for shorter periods of time, more copies per minute can be produced.

This is a clear advantage over prior art processes which required lower intensity, longer exposures to produce positive images without risking reversal.

It is not completely understood why the lowering of the temperature of the composition results in a reduction of the reversal time. One theory is that the viscosity of the internal phase of the photosensitive composition is inversely related to the reversal time for the composition. The lowering the temperature of the photosensitive composition increases the viscosity of the internal phase. Although studies have been performed which show that viscosity and reversal time are inversely related, it is not understood mechanistically why the relationship is an inverse one.

As a direct consequence of the lowering of the reversal time of the composition, as long as the time for delivering an intensity to the composition to enable polymerization exceeds the reversal time, the composition is capable of polymerizing at an acceptable rate. This is evidenced by the density of the exposure reaching a minimum value (referred to as $D_{min}$ on an H&D curve). By reducing the temperature of the photosensitive composition to below ambient temperatures, the composition is able to achieve a minimum density in direct proportionality with exposure.

The present invention may be utilized to produce monochromatic or full color images. Full-color imaging systems are described in U.S. Pat. No. 4,576,891, European Published Application No. 0223587 and U.K. Patent No. 2,113,860. These systems employ imaging sheets having three sets of microcapsules which respectively contain cyan, magenta and yellow color precursors. As explained in more detail in the above-listed references, each set of microcapsules is primarily sensitive in a different wavelength band such that the microcapsules can be individually exposed with minimum cross-talk. In panchromatic systems, the cyan, magenta, and yellow forming photosensitive microcapsules are respectively sensitive to red, green and blue light.

In accordance with the present invention, each of the three sets of microcapsules contains a photohardenable composition. Further, for each set of microcapsules, the composition selected is sensitive to a different wavelength band.

To produce full-color images, the substrate containing the microcapsules is image-wise exposed to high intensity radiation at lower than ambient temperatures. This requires exposures of three different wavelengths, each wavelength corresponding to the sensitivity of the photohardenable composition selected for the corresponding set of microcapsules. Because the substrate is exposed to radiation at lower than ambient temperatures, as discussed above, the microcapsules which are susceptible to reversal are able to withstand high intensity, short term exposures without undergoing reversal (as long as the exposure time to effectuate polymerization when using a source of a given intensity exceeds the reversal time of the microcapsules). In a panchromatic system, it is envisioned that green, blue, and red lasers be used for short term exposure steps. These processes rely upon image process techniques which are well known in the art. It is further contemplated that a high intensity white light source containing at least three bands of actinic radiation may be used for the short term exposures.

After image-wise exposure, if the microcapsules do not contain a dye or pigment, the substrate is brought into contact with a developer material, and the microcapsules are ruptured in the presence of the developer material to produce a full color positive image.

This inventive process is particularly advantageous in that higher intensity sources can be used to polymerize photosensitive compositions without risking reversal (as long as the time for exposure exceeds the reversal time). Functionally, this enables more exposures per minute, and in the case where the inventive process is used to produce photocopies, more photocopies to be produced per minute.

In systems where reversal does not pose a practical problem, the lowering of the temperature of the composition does not prevent the composition from polymerizing and achieving $D_{min}$. In fact, using exposures at reduced temperatures can enable one skilled in the art to optimize system performance parameters such as film speed, dynamic range, image contrast and the like. As such, the inventive process provides beneficial effects even to systems which do not typically suffer from short time scale reciprocity failure.

Moreover, in many instances, the source of radiation and the photosensitive microcapsules may be "fixed" in that it is impossible to alter either. However, the temperature of exposure can be altered to optimize processing conditions. Thus, this gives the operator some control over the imaging process without having to alter the microcapsules or the radiation source.

The invention is illustrated in more detail by the following non-limiting examples:

EXAMPLE 1

The following internal phase was encapsulated in melamine-formaldehyde microcapsules and coated on three mil polyethylene terephthalate film:

| | |
|---|---|
| Trimethylolpropane triacrylate (TMPTA) | 50 parts |
| 1,1'-di-n-heptyl-3,3,3',3'-tetramethylindodi-carbocyanine triphenyl-n-butyl borate | .2 parts |
| Diisopropyl Dimethylamine | 1.0 parts |
| Cyan color former [Hilton Davis HD-5100] | 6 parts |
| Desmodur N-100 Isocyanates | 3.3 parts |

The coated substrate was then image-wise exposed for 4.0 seconds to a 120 watt tungsten halogen light source through a 30 step density wedge at a temperature of 50° C. The experiment was repeated at 20° C. and at 5° C. The values of the image density at step O (the step where $D_{min}$ should be achieved are set forth in Table 1.

TABLE 1

| Temperature | Density at Step 0 |
|---|---|
| 50° C. | 1.08 |
| 20° C. | .46 |
| 5° C. | .17 |

The density of the image for the 50° C. sample reached a minimum at step 13 and then increased, indicating that the composition had reversed. The density of the image for the 20° C. sample reached a minimum at step 10 and then increased, indicating that the composition had reversed. The extent of reversal was less dramatic in the 20° C. sample as compared to the 50° C. sample. The density of the image for the 5° C. sample reached a minimum at step 12 and did not significantly increase, indicating that the composition did not reverse.

EXAMPLE 2

The following internal phase was encapsulated in urea-formaldehyde capsule walls and coated on polyethylene terphthate film.

| | |
|---|---|
| Photomer 4149 (triacrylate supplied by Diamond Shamrock) | 200 parts |
| Irgacure 651 (photoinitiator supplied by Ciba Geigy) | 48 parts |
| Ethyl-p-dimethylaminobenzoate | 8 parts |
| Isopropyl thioxanthone | 8 parts |
| Copikem X | 14.12 parts |
| Hilton Davis S-29904X | 9.88 parts |
| Mobay SF-50 Isocyanates | 6.7 parts |
| Desmodur N-100 Isocyanates | 13.3 parts |

The capsules were exposed to a Sunpack Auto 611 thyristor flash source for about one millisecond at a distance of 4 inches at several temperatures through a 30 step density wedge. The values for $D_{max}$, the lowest density value ($D_{lowest}$), the step number of the lowest density, the density value at step 0 ($D_{min}$) and the temperature of exposure are listed in Table 2.

TABLE 2

| Sample | Temp (°C.) | $D_{max}$ | $D_{lowest}$ | Step($D_{lowest}$) | $D_{min}$ |
|---|---|---|---|---|---|
| 1 | 22 | 1.3 | .93 | 15 | 1.20 |
| 2 | 17 | 1.3 | .77 | 13 | 1.16 |
| 3 | 15 | 1.3 | .70 | 13 | 1.08 |
| 4 | 14 | 1.3 | .63 | 12 | .85 |
| 5 | 5 | 1.3 | .30 | 12 | .70 |
| 6 | 3 | 1.3 | .30 | 12 | .40 |
| 7 | −2 | 1.3 | .10 | 0 | .10 |

Only sample 7 did not exhibit any reversal. Further, the values obtained for $D_{max}$ and $D_{min}$ and the resulting H&D curve for sample 7 were acceptable from a system performance standpoint.

EXAMPLE 3

The following internal phase was encapsulated in urea-formaldehyde capsule walls and coated on polyethylene terephthalate film

| | |
|---|---|
| TMPTA | 200 parts |
| Isopropyl thioxanthone | 4 parts |
| Ethyl-p-dimethylaminobenzoate | 8 parts |
| Copikem X | 24 parts |
| Mobay SF-50 isocyanates | 6.7 parts |
| Desmodur N-100 Isocyanates | 13.3 parts |

The capsules were exposed to a Sunpack Auto 611 thyristor flash source for about one millisecond at a distance of 4 inches at several temperatures through a 30 step density wedge. The values for $D_{max}$, $D_{lowest}$ Step ($D_{lowest}$), $D_{min}$ and Temp (°C.) are listed in Table 3.

TABLE 3

| Sample | Temp (°C.) | $D_{max}$ | $D_{lowest}$ | Step($D_{lowest}$) | $D_{min}$ |
|---|---|---|---|---|---|
| 1 | 100 | 1.38 | 1.38 | — | 1.38 |
| 2 | 80 | 1.38 | 1.11 | 15 | 1.36 |
| 3 | 38 | 1.38 | .61 | 14 | 1.20 |
| 4 | 22 | 1.38 | .18 | 11 | .50 |
| 5 | 20 | 1.38 | .10 | 11 | .36 |
| 6 | 19 | 1.38 | .10 | 11 | .35 |
| 7 | 0 | 1.38 | .06 | 0 | .06 |

Only Sample 7 did not exhibit any reversal. Further, the values obtained for $D_{max}$ and $D_{min}$ and the resulting H & D curve for sample 7 were acceptable. In addition, the lowering of the temperature of Sample 7 to 0° C. did not effect the film speed of the composition.

Having described the invention in detail and by reference to the preferred embodiments thereof, it will be apparent that modifications and variations are possible without departing from the scope of the appended claims.

What is claimed is:

1. A method for exposing a photosensitive imaging sheet comprising the steps of:
   providing an image sheet including a substrate having provided on one of its surfaces a layer of microcapsules, said microcapsules containing an image-forming agent and a photohardenable composition comprising a free radical addition polymerizable or cross-linkable compound and a photoinitiator, said photoinitiator being capable of absorbing actinic radiation and producing free radicals which initiate free radical polymerization or cross-linking of said polymerizable or cross-linkable compound;
   cooling said imaging sheet to a temperature below ambient temperature such that the tendency for said photohardenable composition to exhibit short time scale reciprocacy failure is reduced; and
   image-wise exposing said imaging sheet to actinic radiation while said imaging sheet is at said below ambient temperature.

2. The method according to claim 1 wherein said cooling step comprises cooling said substrate to between about −30° C. and about 15° C.

3. The method according to claim 1 wherein said photoinitiator comprises a cationic dye-borate anion compound.

4. The method according to claim 3 wherein said photoinitiator comprises a cyanine dye-borate anion compound.

5. The method according to claim 1 wherein said image-wise exposing step comprises exposing said substrate to light emitted from a laser.

6. The method according to claim 5 wherein said photosensitive composition is sensitive to visible light.

7. The method according to claim 1 wherein said image-wise exposing step comprises exposing said substrate to actinic radiation have an intensity greater than about 1000 ergs/cm² sec.

8. The method according to claim 1 comprising the additional step of subjecting said microcapsules to a uniform rupturing force in the presence of a receiver sheet to cause said image-forming agent to migrate to said receiver sheet and form an image.

9. A method for exposing a full color imaging sheet comprising the steps of:
   providing an imaging sheet including a substrate having provided on one of its surfaces a coating comprising a first set of microcapsules including a first image-forming agent and a photohardenable composition being sensitive to a first band of radiation associated with said first image-forming agent, a second set of microcapsules including a second image-forming agent and a photohardenable composition being sensitive to a second band of radiation associated with said second image-forming agent, and a third set of microcapsules including a third image-forming agent and a photohardenable composition being sensitive to a third band of radiation associated with said third image-forming agent;

cooling said imaging sheet to below ambient temperatures such that the tendency for said photohardenable composition to exhibit short time scale reciprocity failure is reduced; and image-wise exposing said imaging sheet to said three bands of actinic radiation.

10. The method according to claim 9 wherein said three image-forming agents comprise cyan color-forming, yellow color-forming and magenta color-forming agents.

11. The method according to claim 10 wherein said image-wise exposing step comprises exposing said microcapsules to radiation emitted from three lasers.

12. The method according to claim 11 wherein said three lasers comprise a first laser emitting red light, a second laser emitting green light and a third laser emitting blue light.

13. The method according to claim 9 wherein said cooling step comprises cooling said substrate to between about −30° C. and about 15° C.

14. The method according to claim 9 wherein at least one of said first, second or third photohardenable compounds includes a photoinitiator comprising a cationic dye-borate anion compound.

15. The method according to claim 9 comprising the additional step of subjecting said first, second and third set of microcapsules to a uniform rupturing force in the presence of a receiver sheet to cause said three image-forming agents to migrate to said receiver sheet and form an image.

16. The method according to claim 15 wherein said receiver sheet contains a developer material capable of reacting with said image-forming agents to form full-color images.

17. The method according to claim 16 wherein said developer material is located on a sheet separate from said substrate containing said three sets of microcapsules.

18. The method according to claim 16 wherein said developer material is located on said substrate containing said three sets of microcapsules.

* * * * *